(12) United States Patent
Kato et al.

(10) Patent No.: US 12,205,817 B2
(45) Date of Patent: Jan. 21, 2025

(54) METHOD FOR DEPOSITING FILM AND FILM DEPOSITION SYSTEM

(71) Applicant: Tokyo Electron Limited, Tokyo (JP)

(72) Inventors: Hitoshi Kato, Iwate (JP); Toru Ishii, Iwate (JP); Yuji Seshimo, Yamanashi (JP); Yuichiro Sase, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 181 days.

(21) Appl. No.: 17/647,032

(22) Filed: Jan. 5, 2022

(65) Prior Publication Data
US 2022/0223408 A1    Jul. 14, 2022

(30) Foreign Application Priority Data
Jan. 14, 2021   (JP) .................. 2021-004433

(51) Int. Cl.
| | | |
|---|---|---|
| *C23C 16/40* | (2006.01) | |
| *C23C 16/455* | (2006.01) | |
| *C23C 16/458* | (2006.01) | |
| *C23C 16/56* | (2006.01) | |
| *H01J 37/32* | (2006.01) | |
| *H01L 21/02* | (2006.01) | |

(52) U.S. Cl.
CPC ...... *H01L 21/02164* (2013.01); *C23C 16/401* (2013.01); *C23C 16/45536* (2013.01); *C23C 16/4584* (2013.01); *C23C 16/56* (2013.01); *H01J 37/32724* (2013.01); *H01L 21/02211* (2013.01); *H01L 21/02274* (2013.01); *H01L 21/0228* (2013.01); *H01J 2237/20214* (2013.01); *H01J 2237/332* (2013.01); *H01J 2237/338* (2013.01)

(58) Field of Classification Search
None
See application file for complete search history.

(56) References Cited

U.S. PATENT DOCUMENTS

| | | | |
|---|---|---|---|
| 2016/0099143 A1* | 4/2016 | Yan ................... | C23C 16/45551 438/782 |
| 2019/0203354 A1* | 7/2019 | Smith ................ | H01L 21/0228 |
| 2019/0284691 A1* | 9/2019 | Miura ............... | C23C 16/45536 |

FOREIGN PATENT DOCUMENTS

| | | |
|---|---|---|
| JP | 2013-135154 | 7/2013 |
| JP | 2014-022653 | 2/2014 |

* cited by examiner

*Primary Examiner* — Shamim Ahmed
*Assistant Examiner* — Bradford M Gates
(74) *Attorney, Agent, or Firm* — IPUSA, PLLC

(57) ABSTRACT

A method for depositing a silicon oxide film is provided. In the method, a silicon oxide film is deposited on a substrate by Atomic Layer Deposition with plasma while heating the substrate to a first temperature of 600° C. or higher. The silicon oxide film is annealed at a second temperature higher than the first temperature after completing the depositing the silicon oxide film.

8 Claims, 19 Drawing Sheets

METHOD FOR DEPOSITING FILM AND FILM DEPOSITION SYSTEM

CROSS-REFERENCE TO RELATED APPLICATION

The present application is based on and claims priority to Japanese Priority Application No. 2021-004433 filed on Jan. 14, 2021, the entire contents of which are hereby incorporated herein by reference.

BACKGROUND OF THE INVENTION

1. Field of the Invention

The present disclosure relates to a method for depositing a film and a film deposition system.

2. Description of the Related Art

Japanese Laid-Open Patent Application Publication No. 2013-135154 discloses a method for depositing a film that supplies a first reaction gas to a substrate after adsorbing a hydroxyl group on an inner surface of a recess formed on a substrate with a desired distribution, and that produces a reaction product by causing a first reaction gas and a second reaction gas to react with each other, thereby depositing a film.

In such a deposition method, plasma is used to form a hydroxyl group, but the plasma is often used to perform the entire process at a low temperature, and the plasma process is often performed at a temperature of around 400 degrees C.

SUMMARY OF THE INVENTION

The present disclosure provides a method for depositing a silicon oxide film having a film quality as uniform as that of a thermal oxide film by combining a high-temperature plasma modification with annealing.

According to one embodiment of the present disclosure, there is provided a method for depositing a silicon oxide film. In the method, a silicon oxide film is deposited on a substrate by Atomic Layer Deposition with plasma while heating the substrate to a first temperature of 600° C. or higher. The silicon oxide film is annealed at a second temperature higher than the first temperature after completing the depositing the silicon oxide film.

DETAILED DESCRIPTION OF THE PREFERRED EMBODIMENTS

Hereinafter, embodiments for carrying out the present invention will be described with reference to the drawings.

[Film Deposition Apparatus]

Figure 1:
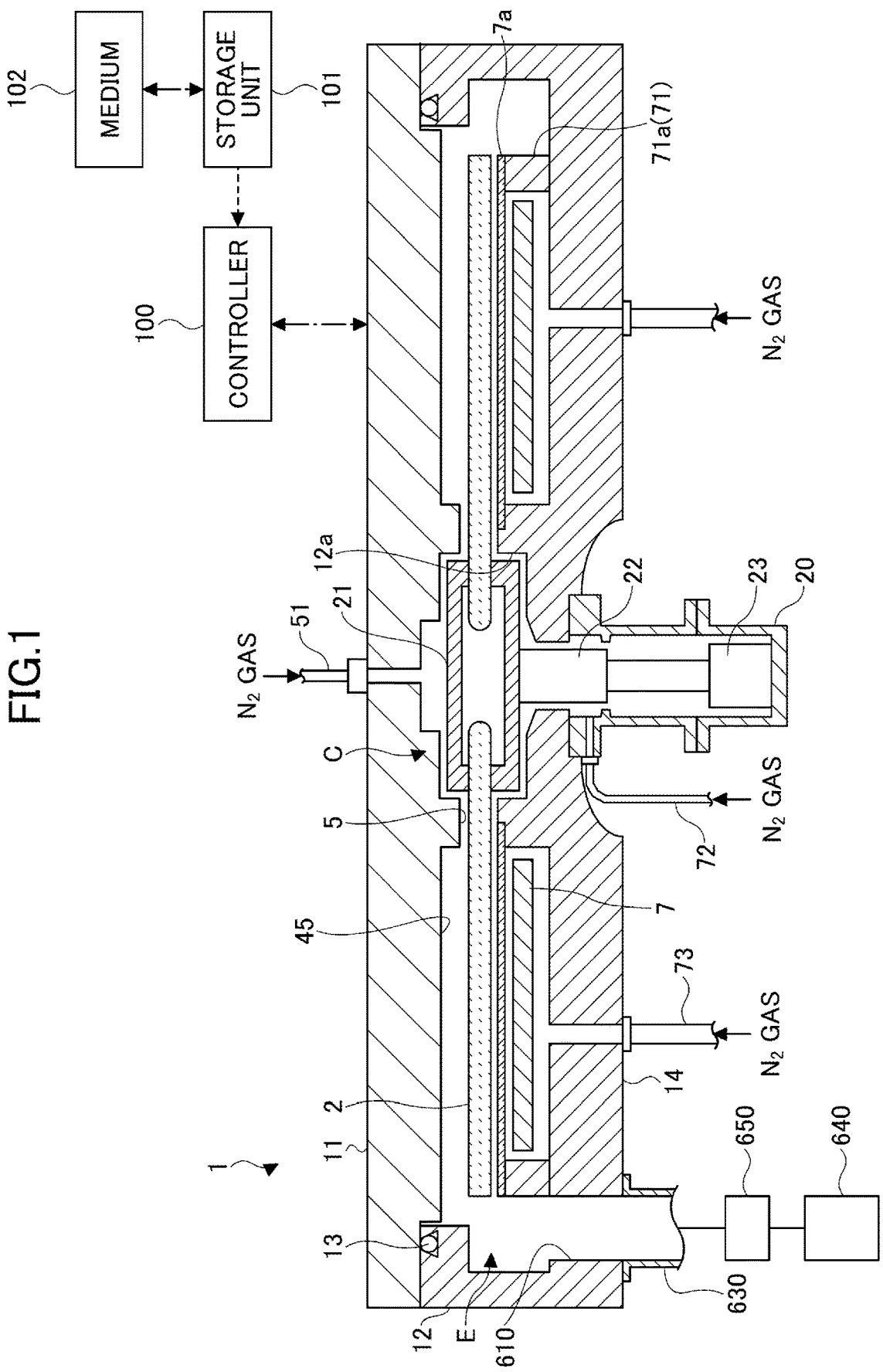
FIG. 1 is a schematic cross-sectional view illustrating a film deposition apparatus according to an embodiment of the present invention.
Figure 2:
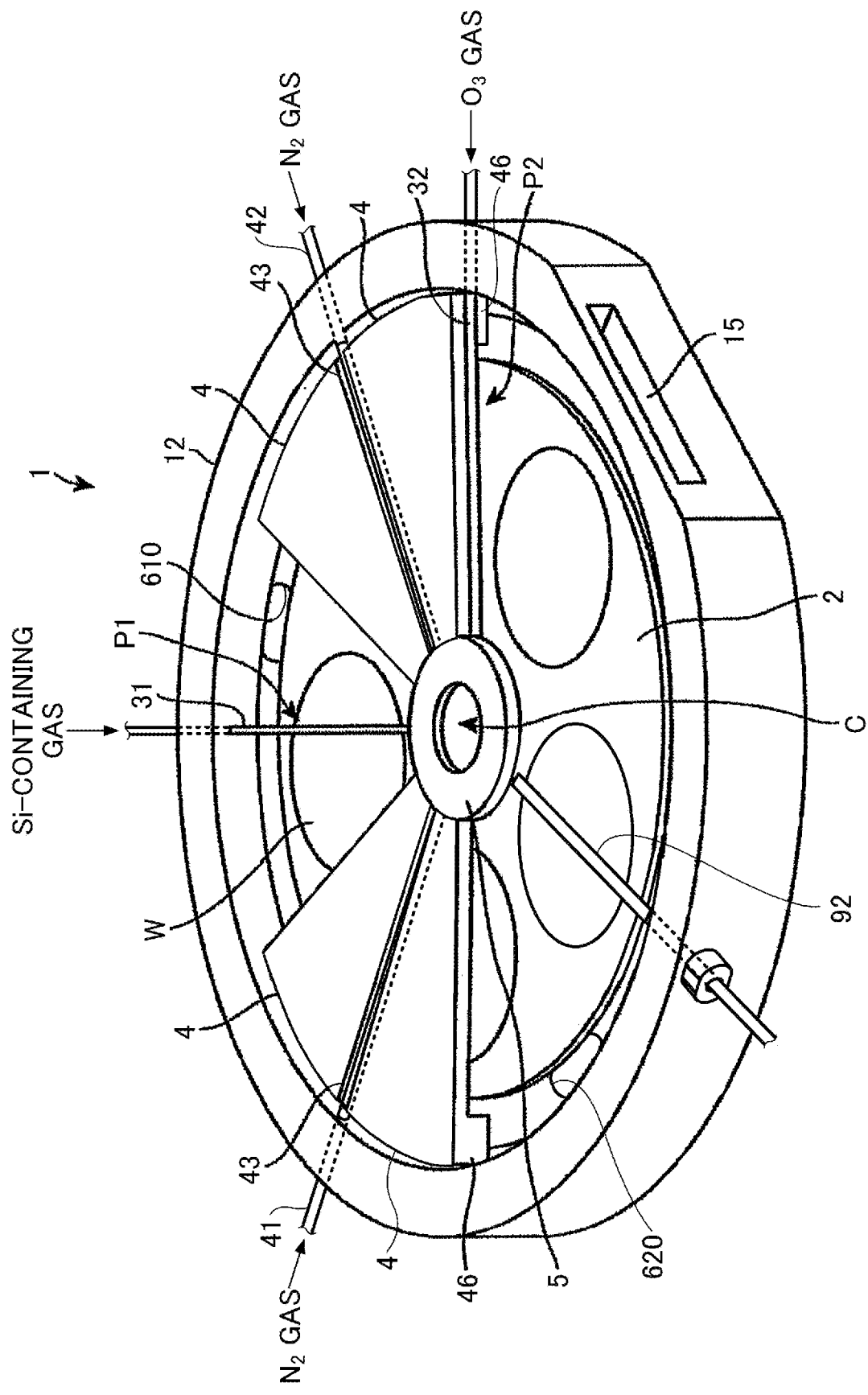
FIG. 2 is a schematic perspective view illustrating a configuration in a vacuum chamber of a film deposition apparatus.
Figure 3:
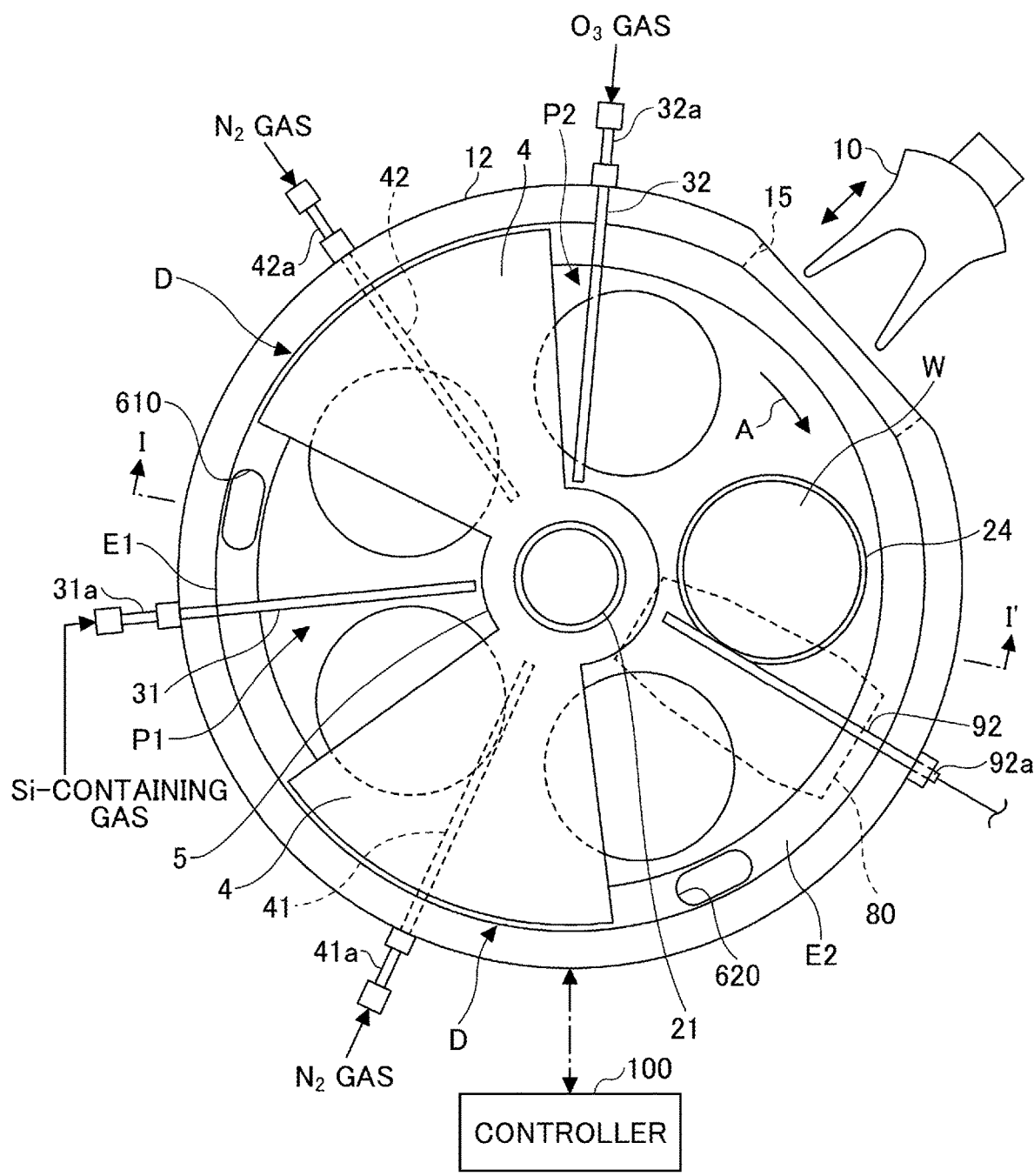
FIG. 3 is a schematic plan view illustrating a configuration in a vacuum chamber of a film deposition apparatus.

First, a film deposition apparatus suitable for carrying out a method for depositing a film according to an embodiment of the present disclosure will be described. Referring to FIGS. 1 through 3, the film deposition apparatus includes a flat vacuum chamber 1 having a substantially circular shape in a plan view and a turntable 2 disposed in the vacuum chamber 1 having a center of rotation at the center of the vacuum chamber 1. The vacuum chamber 1 has a chamber body 12 having a cylindrical shape with a bottom and a top plate 11 that is disposed on the top face of the chamber body 12 in an air-tight manner via a sealing member (FIG. 1) such as an O-ring.

The turntable 2 is provided in the vacuum chamber 1 and has a center of rotation at the center of the vacuum chamber 1. The turntable 2 is attached to the cylindrical shaped core unit 21 at its center portion. The core unit 21 is fixed to the upper end of the rotary shaft 22 which extends in the vertical direction. The rotary shaft 22 is provided to penetrate the bottom portion 14 of the vacuum chamber 1 and its lower end is attached to the driving unit 23 that rotates the rotary shaft (FIG. 1) around a vertical direction. The rotary shaft 22 and the driving unit 23 are housed in the tubular case body 20 whose upper surface is open. The case body 20 is attached to a lower surface of the bottom portion 14 of the vacuum chamber 1 via a flange portion provided at its upper surface in an airtight manner so that the inner atmosphere of the case body 20 is isolated from outside atmosphere.

As illustrated in FIG. 2 and FIG. 3, plural (five in this case) circular recesses 24 are provided at a front surface of the turntable 2 along a rotating direction (circumferential direction) illustrated by an arrow A for holding plural semiconductor wafers (which will be simply referred to as "wafers" hereinafter) W, respectively. Here is an example where the wafer W is illustrated to be placed in one of the recesses 24 in FIG. 3 for an explanatory purpose.

Each of the recesses 24 is formed to have a slightly larger (for example, 4 mm larger) diameter than that (for example, 300 mm) of the wafer W, and a depth substantially equal to the thickness of the wafer W. Thus, when the wafer W is mounted in the respective recess 24, the surface of the wafer W and the surface of the turntable 2 (where the wafer W is not mounted) become almost the same height. As will be explained later, each of the recesses 24 are provided with three, for example, through holes, through which lift pins for supporting a back surface of the respective wafer W and lifting the wafer W penetrate.

A reaction gas nozzle 31, a reaction gas nozzle 32, separation gas nozzles 41 and 42, and a gas introduction nozzle 92, which are made of quartz, for example, are provided above the turntable 2. For the example illustrated in FIG. 3, the gas introduction nozzle 92, the separation gas nozzle 41, the reaction gas nozzle 31, the separation gas nozzle 42, and the reaction gas nozzle 32 are disposed in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 92a, 31a, 32a, 41a, and 42a (FIG. 3) which are base portions of the nozzles 92, 31, 32, 41, and 42, respectively, are fixed to an outer peripheral wall of the chamber body 12 so that these nozzles 92, 31, 32, 41, and 42 are introduced into the vacuum chamber 1 from the outer peripheral wall of the vacuum chamber 1 to extend in a radial direction and parallel to the surface of the turntable 2.

As simply illustrated by a dotted line for an explanatory purpose in FIG. 3, a plasma source 80 is provided above the gas introduction nozzle 92. The plasma source 80 is explained later.

In this embodiment, the reaction gas nozzle 31 is connected to a supplying source (not illustrated in the drawings) of a Si (silicon) containing gas as a first reaction gas via a pipe, a flow controller and the like (not illustrated in the drawings). The reaction gas nozzle 32 is connected to a supplying source (not illustrated in the drawings) of an oxidation gas as a second reaction gas via a pipe, a flow controller and the like (not illustrated in the drawings). The separation gas nozzles 41 and 42 are connected to supplying sources (not illustrated in the drawings) of nitrogen ($N_2$) gas as a separation gas via pipes and flow controller valves and the like, respectively.

In this embodiment, organo-aminosilane gas is used as the Si containing gas, and $O_3$ (ozone) gas is used as the oxidation gas.

The reaction gas nozzles 31 and 32 are provided with plural gas discharge holes 33 (see FIG. 4) which are facing downward to the turntable 2 along the longitudinal directions of the reaction gas nozzles 31 and 32 with a 10 mm interval, respectively, for example. An area below the reaction gas nozzle 31 is a first process area P1 in which the Si containing gas is adsorbed onto the wafers W. An area below the reaction gas nozzle 32 is a second process area P2 in which the Si containing gas which is adsorbed onto the wafer W at the first process area P1 is oxidized.

Referring to FIG. 2 and FIG. 3, the ceiling plate 11 is provided with two protruding portions 4 protruding in the vacuum chamber 1. Each of the protruding portions 4 has substantially a sector top view shape where the apex is removed in an arc shape. For each of the protruding portions 4, the inner arc shaped portion is connected to an inner protruding portion 5 (which will be explained later with reference to FIG. 1 to FIG. 3) and the outer arc shaped portion is formed to extend along an inner peripheral surface of the chamber body 12 of the vacuum chamber 1. As will be explained later, the protruding portions are attached at a lower surface of the ceiling plate 11 to protrude toward the turntable 2 to form separation areas D with the corresponding separation gas nozzles 41 and 42.

Figure 4:
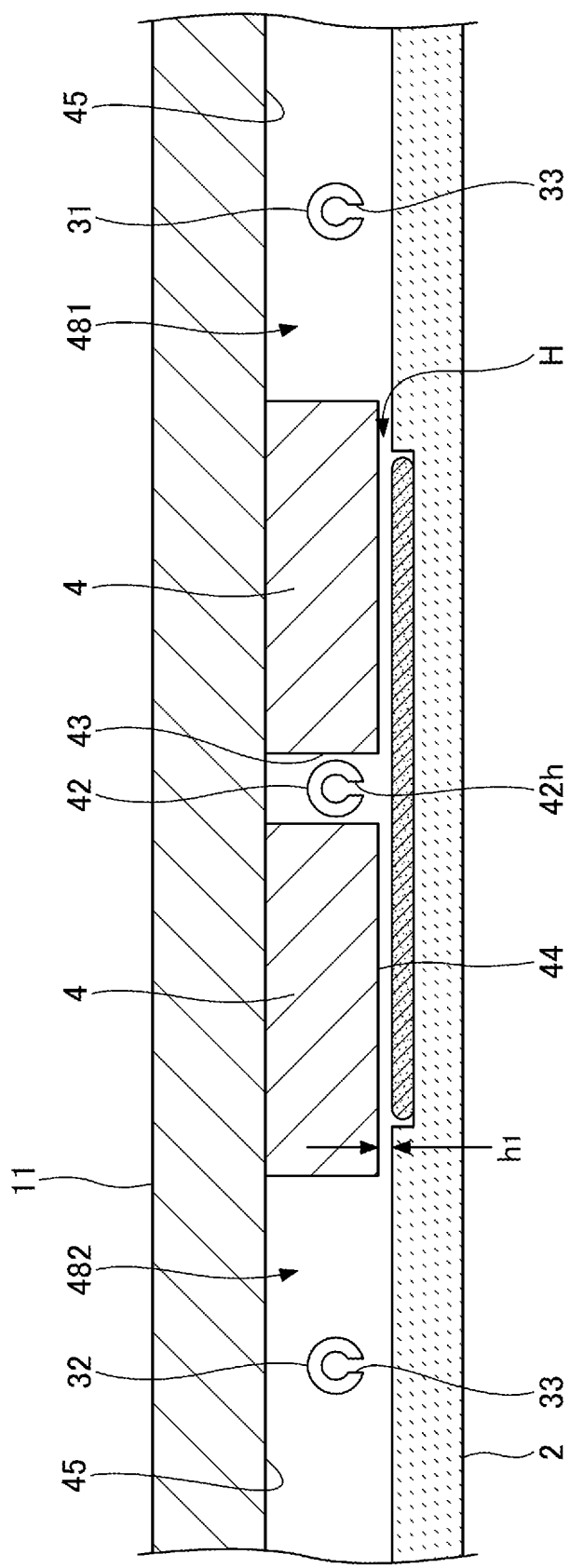
FIG. 4 is a schematic cross-sectional view of a vacuum chamber along a concentric circle of a turntable rotatably disposed in a vacuum chamber of a film deposition apparatus.

FIG. 4 shows a cross-section of the vacuum chamber 1 along a concentric circle of the turntable 2 from the reaction gas nozzle 31 to the reaction gas nozzle 32. As illustrated in FIG. 4, the protruding portion 4 is fixed to the lower surface of the ceiling plate 11. Thus, there are provided a flat low ceiling surface 44 (first ceiling surface) formed as the lower surface of the protruding portion 4 and flat higher ceiling surfaces 45 (second ceiling surface) which are higher than the low ceiling surface 44 and formed at outboard sides of the low ceiling surface 44 in the circumferential direction. The low ceiling surface 44 has substantially a sector top view shape where the apex is removed in an arc shape.

Further, as illustrated in the drawings, the protruding portion 4 is provided with a groove portion 43 at a center in the circumferential direction. The groove portion 43 is formed to extend in the radius direction of the turntable 2. The separation gas nozzle 42 is positioned within the groove portion 43. Although not illustrated in FIG. 4, the separation gas nozzle 41 is also positioned within a groove portion provided in the other protruding portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, for an explanatory purpose, a space below the high ceiling surface 45 where the reaction gas nozzle 31 is provided is referred to as "481" and a space below the high ceiling surface 45 where the reaction gas nozzle 32 is provided is referred to as "482" as illustrated in FIG. 4.

The separation gas nozzle 42 is provided with plural gas discharge holes 42h formed along the longitudinal direction of the separation gas nozzle 42 with a predetermined interval (10 mm, for example).

The low ceiling surface 44 provides a separation space H, which is a small space, with respect to the turntable 2. When the $N_2$ gas is provided from the separation gas nozzle 42, the $N_2$ gas flows toward the space 481 and the space 482 through the separation space H. At this time, as the volume of the separation space H is smaller than those of the spaces 481 and 482, the pressure in the separation space H can be made higher than those in the spaces 481 and 482 by the $N_2$ gas. It means that between the spaces 481 and 482, the separation space H provides a pressure barrier.

Further, the $N_2$ gas flowing from the separation space H toward the spaces 481 and 482 functions as a counter flow against the Si containing gas from the gas first process area P1 and the oxidation gas from the second process area P2. Thus, the Si containing gas from the first process area P1 and the oxidation gas from the second process area P2 are separated by the separation space H. Therefore, mixing and reacting of the Si containing gas with the oxidation gas are prevented in the vacuum chamber 1.

The height h1 of the low ceiling surface 44 above an upper surface of the turntable 2 may be appropriately determined based on the pressure of the vacuum chamber 1 at a film deposition time, the rotational speed of the turntable 2, and a supplying amount of the separation gas ($N_2$ gas) in order to maintain the pressure in the separation space H higher than those in the spaces 481 and 482.

Referring to FIG. 1 to FIG. 3, the ceiling plate 11 is further provided with the inner protruding portion 5 at its lower surface to surround the outer periphery of the core unit 21 which fixes the turntable 2. The inner protruding portion 5 is continuously formed with the inner portions of the protruding portions 4 and has a lower surface which is formed at the same height as those of the low ceiling surfaces 44, in this embodiment.

Figure 5:
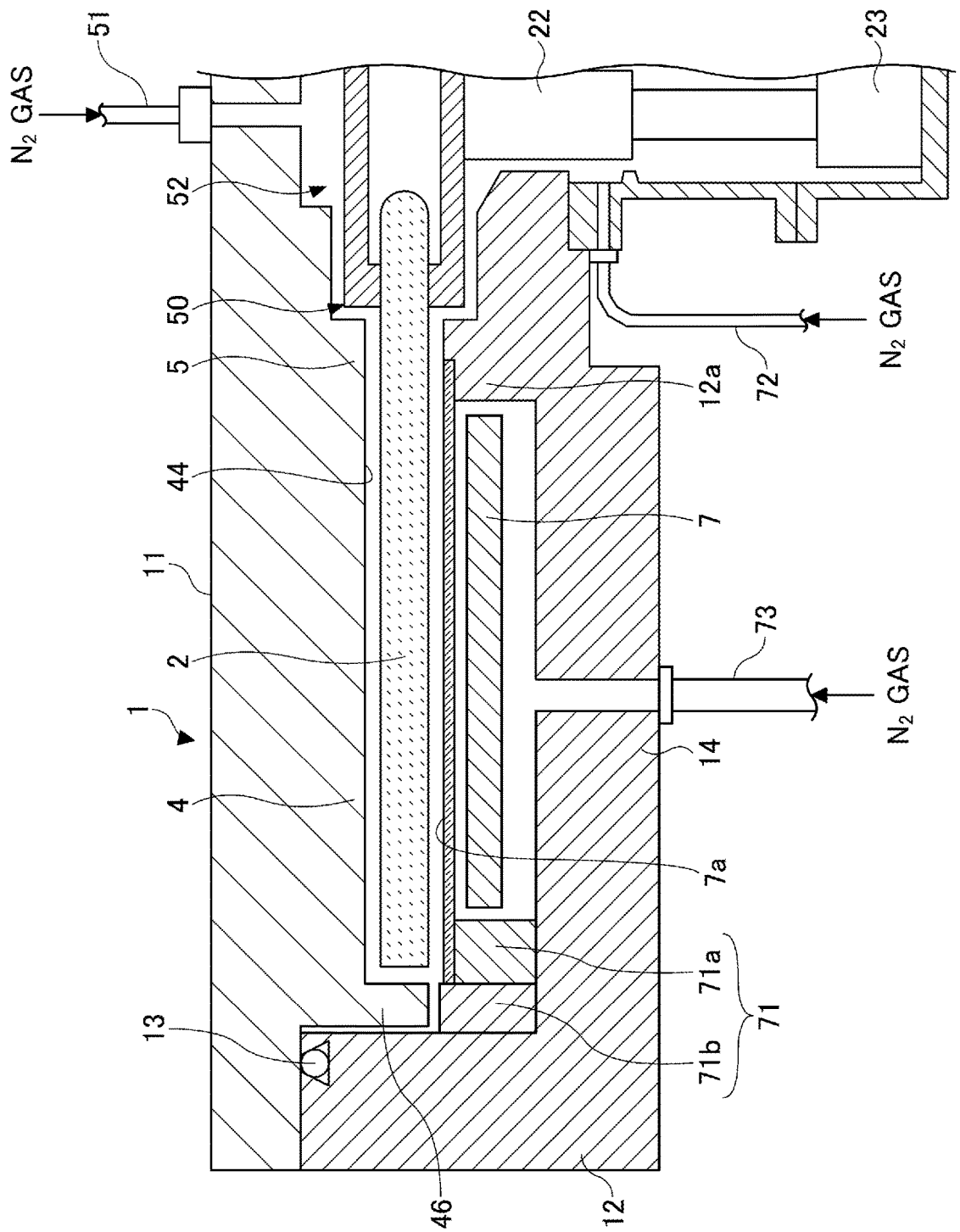
FIG. 5 is another schematic cross-sectional view of a film deposition apparatus.

FIG. 1 is a cross-sectional view taken along an I-I' line in FIG. 3, and showing an area where the ceiling surface 45 is provided. FIG. 5 is a partial cross-sectional view showing an area where the ceiling surface 44 is provided. As illustrated in FIG. 5, the protruding portion 4 having a substantially sector top view shape is provided with an outer bending portion 46 at its outer peripheral end portion (at an outer peripheral end portion side of the vacuum chamber 1) which is bent to have an L-shape to face an outer end surface of the turntable 2. The outer bending portion 46 suppresses a flow of gas between the space 481 and the space 482 through the space between the turntable 2 and the inner peripheral surface of the chamber body 12. As described above, the protruding portions 4 are provided on the ceiling plate 11 which is detachably attached to the chamber body 12. Thus, there is a slight space between the outer periphery surface of the outer bending portion 46 and the chamber body 12. The space between the inner periphery surface of the outer bending portion 46 and an outer surface of the turntable 2, and the space between the outer periphery surface of the outer bending portion 46 and the chamber body 12 may be a size same as the height h1 (see FIG. 4) of the low ceiling surface 44 with respect to the upper surface of the turntable 2, for example.

As illustrated in FIG. 5, the inside perimeter wall of the chamber body 12 is provided to extend in a vertical direction to be closer to the outer peripheral surface of the outer bending portion 46 at the separation area H. However, other than the separation area H, as illustrated in FIG. 1, for example, the inside perimeter wall of the chamber body 12 is formed to have a recess outside of a portion facing the outer end surface of the turntable 2 toward the bottom portion 14. Hereinafter, for an explanatory purpose, the concave portion, having a substantially rectangular cross-sectional view, is referred to as an "evacuation area". Specifically, a part of the evacuation area which is in communication with the first process area P1 is referred to as a first evacuation area E1, and a part of the evacuation area which is in communication with the second process area P2 is referred to as a second evacuation area E2. As illustrated in FIG. 1 to FIG. 3, a first evacuation port 610 and a second evacuation port 620 are respectively provided at the bottom portions of the first evacuation area E1 and the second evacuation area E2. The first evacuation port 610 and the second evacuation port 620 are connected to vacuum pumps 640, which are vacuum evacuation units, via evacuation pipes 630, respectively, as illustrated in FIG. 1. The reference numeral 650 is a pressure regulator in FIG. 1.

The heater unit 7 is provided at a space between the turntable 2 and the bottom portion 14 of the vacuum chamber 1 as illustrated in FIG. 1 and FIG. 5. The wafers W mounted on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from being introduced into the space below the turntable 2. As illustrated in FIG. 5, the cover member 71 includes an inner member 71a that is disposed to face the outer end portion of the turntable 2 and slightly outside the outer end portion of the turntable 2 from a lower side, and an outer member 71b which is provided between the inner member 71a and an inner wall surface of the chamber body 12. The outer member 71b is provided to face the outer bending portion 46, which is formed at an outer edge portion at a lower side of each of the protruding portions 4. The inner member 71a is provided to surround the entirety of the heater unit 7 below the outer end portion (and slightly outside the outer end portion) of the turntable 2.

As illustrated in FIG. 1, the bottom portion 14 of the vacuum chamber 1 closer to the rotation center than the space where the heater unit 7 is positioned protrudes upward to be close to the core unit 21 to form a protruded portion 12a. There is provided a small space between the protruded portion 12a and the core unit 21. Further, there is provided a small space between an inner peripheral surface of the bottom portion 14 and the rotary shaft 22 to be in communication with the case body 20. A purge gas supplying pipe 72 which supplies $N_2$ gas as the purge gas to the small space for purging is provided in the case body 20. The bottom portion 14 of the vacuum chamber 1 is provided with plural purge gas supplying pipes 73 (only one of the purge gas supplying pipes 73 is illustrated in FIG. 5) which are provided with a predetermined angle interval in the circumferential direction below the heater unit 7 for purging the space where the heater unit 7 is provided.

Further, a cover member 7a is provided between the heater unit 7 and the turntable 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

The film deposition apparatus further includes a separation gas supplying pipe 51 which is connected to a center portion of the ceiling plate 11 of the vacuum chamber 1 and provided to supply $N_2$ gas as the separation gas to the space 52 between the ceiling plate 11 and the core unit 21. The separation gas supplied to the space 52 flows through a small space between the inner protruding portion 5 and the turntable 2 to flow along a front surface of the turntable 2 where the wafers W are to be mounted to be discharged from an outer periphery. The space 50 is kept at a pressure higher those of the space 481 and the space 482 by the separation gas. Thus, the mixing of the Si containing gas supplied to the first process area P1 and the oxidation gas supplied to the second process area P2 by flowing through the center area C can be prevented by the space 50. It means that the space 50 (or the center area C) can function similarly as the separation space H (or the separation area D).

Further, as illustrated in FIG. 2 and FIG. 3, a transfer port 15 is provided at a side wall of the vacuum chamber 1 for allowing the wafers W, which are substrates, to pass between an external transfer arm 9 and the turntable 2. The transfer port 15 is opened and closed by a gate valve (not illustrated in the drawings). Further, lift pins, which penetrate the recess 24 to lift up the respective wafer W from a backside surface, and a lifting mechanism for the lift pins (both are not illustrated in the drawings) are provided at a respective portion below the turntable 2. Thus, the respective wafer W is passed between the external transfer arm 9 and the recess 24 of the turntable 2, which is a mounting portion, at a place facing the transfer port 15.

Figure 6:
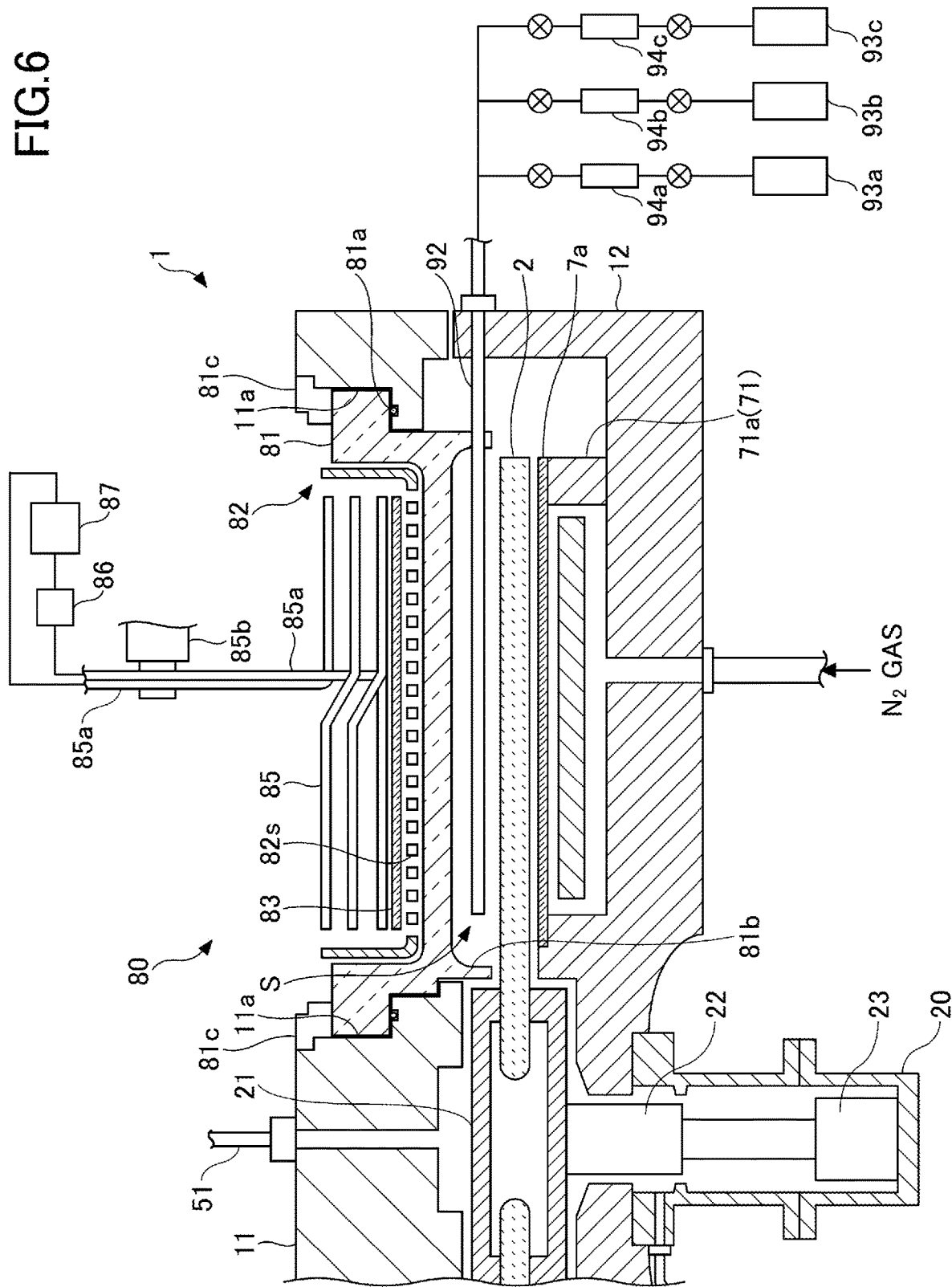
FIG. 6 is a schematic cross-sectional view illustrating a plasma source disposed in a film deposition apparatus.
Figure 7:
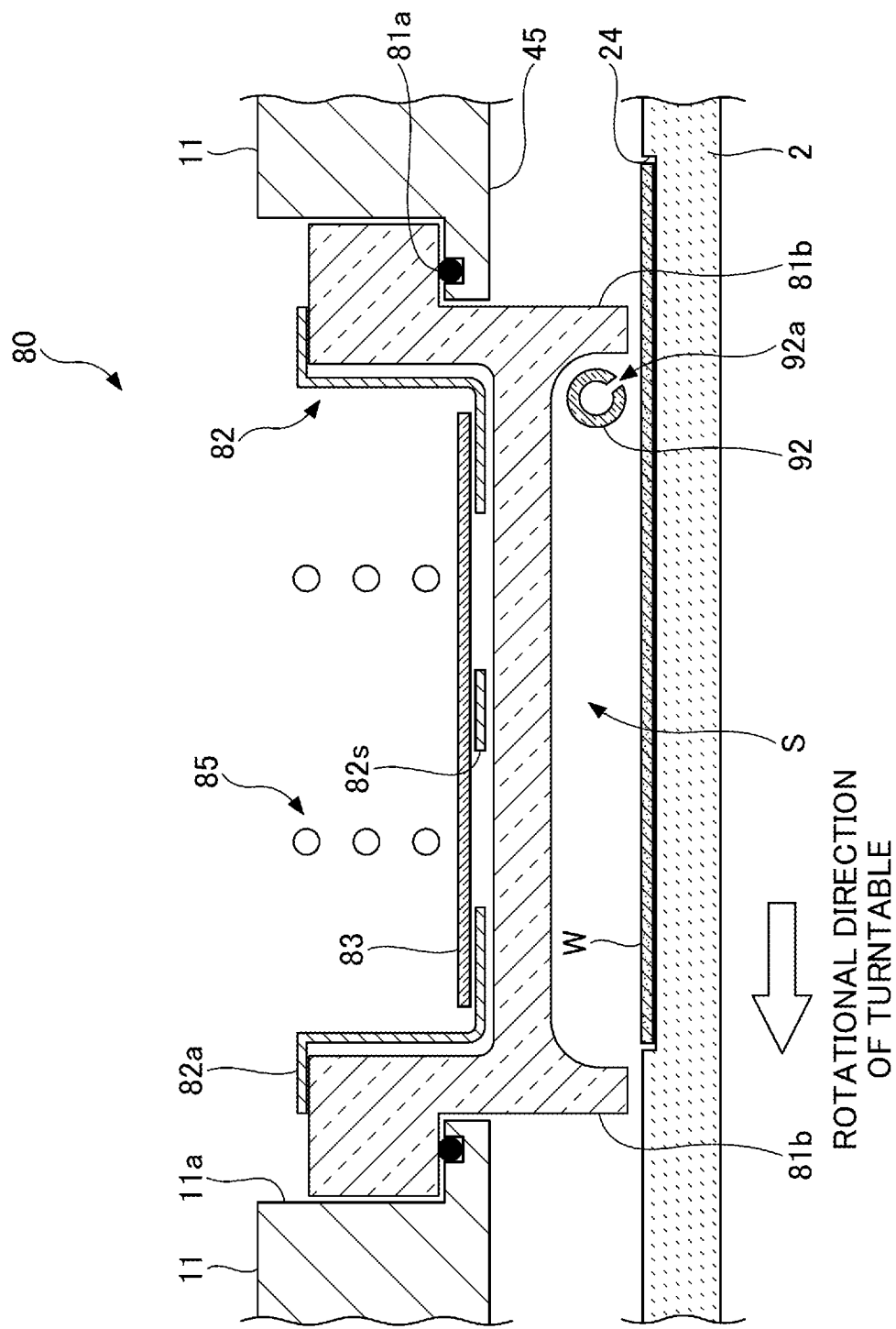
FIG. 7 is another schematic cross-sectional view illustrating a plasma source disposed in a film deposition apparatus.
Figure 8:
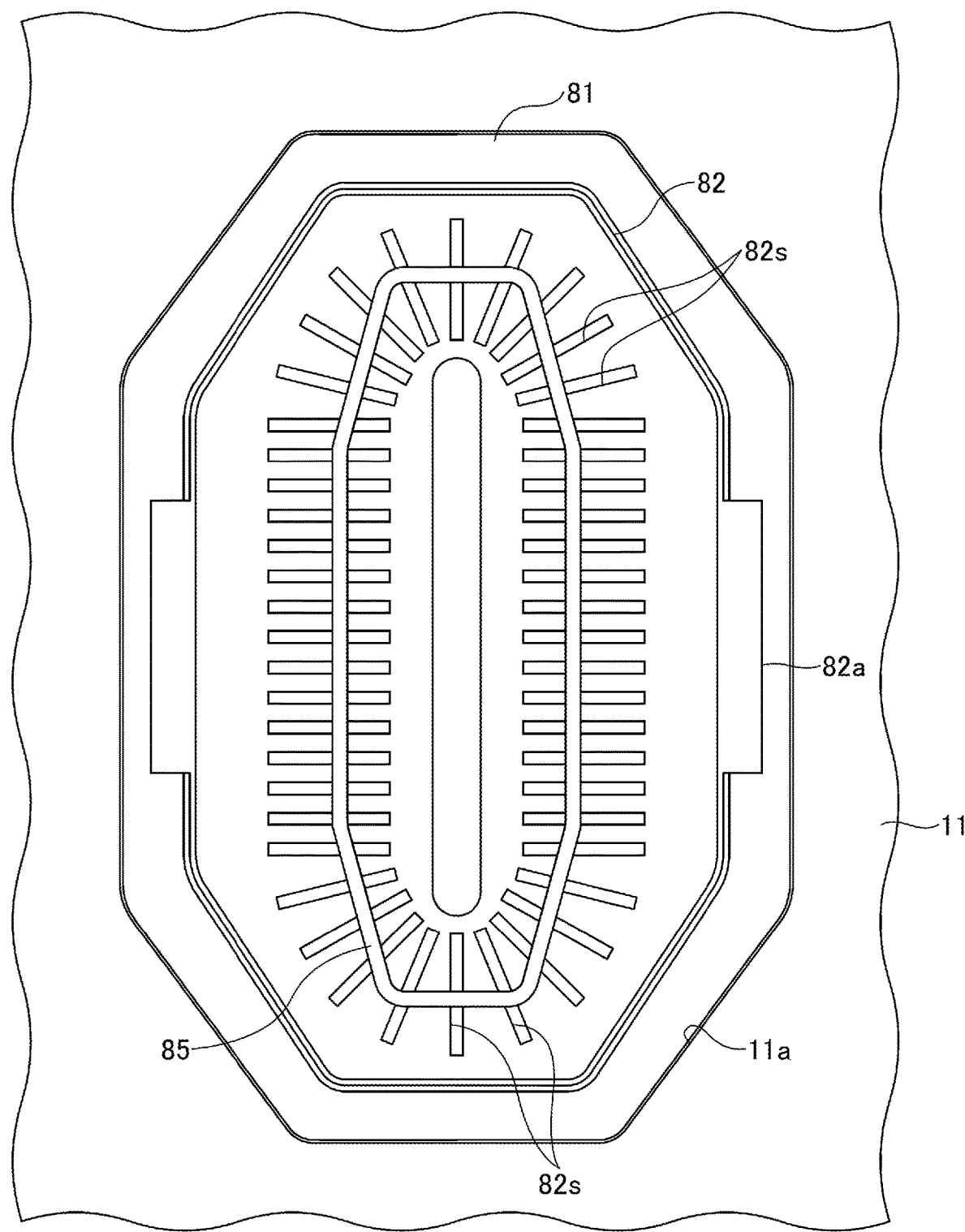
FIG. 8 is a schematic top view illustrating a plasma source disposed in a deposition apparatus.

Next, the plasma source 80 is explained with reference to FIG. 6 to FIG. 8. FIG. 6 is a schematic cross-sectional view of the plasma source 80 taken along the radius direction of the turntable 2. FIG. 7 is a schematic cross-sectional view of the plasma source 80 taken along a direction perpendicular to the radius direction of the turntable 2. FIG. 8 is a schematic top view showing the plasma source 80. For an explanatory purpose, parts of the components are not illustrated in the drawings.

Referring to FIG. 6, the plasma source 80 is made of a material which is permeable to high frequency waves, and is provided with a recessed portion in its upper surface. The plasma source 80 further includes a frame member 81 which is embedded in an open portion 11a provided in the ceiling plate 11, a Faraday shield plate 82 housed in the concave portion of the frame member 81 and has substantially a box shape whose top is opened, an insulating plate 83 placed on a bottom surface of the Faraday shield plate 82, and a coil antenna 85 supported above the insulating plate 83. The antenna 85 has substantially an octagonal upper plane shape.

The open portion 11a of the ceiling plate 11 is formed to have plural step portions, and one of the step portions is provided with a groove portion to extend along the perimeter where a sealing member 81a such as an O-ring or the like is embedded. The frame member 81 is formed to have plural step portions which correspond to the step portions of the open portion 11a, and when the frame member 81 is engaged in the open portion 11a, a back side surface of one of the step portions contacts the sealing member 81a embedded in the open portion 11a so that the ceiling plate 11 and the frame member 81 are kept in an air-tight manner.

Further, as illustrated in FIG. 6, a pushing member 81c, which extends along the outer peripheral of the frame member 8 which is embedded in the open portion 11a of the ceiling plate 11, is provided so that the frame member 81 is pushed downward with respect to the ceiling plate 11. With this, the ceiling plate 11 and the frame member 81 are further kept in an air-tight manner. The lower surface of the frame member 81 is positioned to face the turntable 2 in the vacuum chamber 1 and a projection portion 81b which projects downward (toward the turntable 2) is provided at the perimeter at the lower surface. The lower surface of the projection portion 81b is close to the surface of the turntable 2 and a space (hereinafter referred to as an inner space S) is provided by the projection portion 81b, the surface of the turntable 2, and the lower surface of the frame member 81 above the turntable 2. The space between the lower surface of the projection portion 81b and the surface of the turntable 2 may be the same as the height h1 between the ceiling surface 44 with respect to the upper surface of the turntable 2 in the separation space H (FIG. 4).

Further, a gas introduction nozzle 92 which penetrates the projection portion 81b is provided in the inner space S. In this embodiment, as illustrated in FIG. 6, an argon gas supplying source 93a filled with argon (Ar) gas, an oxygen gas supplying source 93b filled with oxygen ($O_2$) gas, and an ammonia gas supplying source 93c filled with ammonia ($NH_3$) gas are connected to the gas introduction nozzle 92. The Ar gas, the $O_2$ gas, and the $NH_3$ gas which are flow controlled by flow controllers 94a, 94b, and 94c are supplied from the argon gas supplying source 93a, the oxygen gas supplying source 93b, and the ammonia gas supplying source 93c, respectively, with a predetermined flow rate ratio (mixed ratio) to the inner space S.

The gas introduction nozzle 92 is provided with plural gas discharge holes 92a formed along the longitudinal direction thereof with a predetermined interval (10 mm, for example) so that the Ar gas and the like is discharged from the gas discharge holes 92a. As illustrated in FIG. 7, the gas discharge holes 92a are provided to be inclined from a vertical direction with respect to the turntable 2 toward the upstream rotation direction of the turntable 2. Thus, the gas supplied from the gas introduction nozzle 92 is discharged in a direction opposite to the rotation direction of the turntable 2, specifically, toward a space between a lower surface of the projection portion 81b and the surface of the turntable 2. With this, the flows of the reaction gas and the separation gas from a space below the ceiling surface 45 which is upstream of the plasma source 80 toward the inner space S along the rotation direction of the turntable 2 can be prevented. Further, as described above, as the projection portion 81b which is formed along an outer periphery of the lower surface of the frame member 81 is close to the surface of the turntable 2, the pressure in the inner space S can be kept high by the gas from the gas introduction nozzle 92. With this as well, the flows of the reaction gas and the separation gas toward the inner space S can be prevented.

The Faraday shield plate 82 is made of a conductive material such as a metal and is grounded, although not illustrated in the drawings. As clearly illustrated in FIG. 8, the Faraday shield plate 82 is provided with plural slits 82s at its bottom portion. Each of the slits 82s extend to be substantially perpendicular to the corresponding lines of the antenna 85 which has the substantially octagonal plane shape.

As illustrated in FIG. 7 and FIG. 8, the Faraday shield plate 82 includes two support portions 82a which are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 and the antenna 85 while allowing transmission of the high frequency wave radiated from the antenna 85.

The antenna 85 is formed by winding a pipe made of copper three times, for example, in a substantially octagonal plane shape. With this structure, cooling water can be circulated in the pipe and the antenna 85 is prevented from being heated to be a high temperature by the high frequency wave provided to the antenna 85. The antenna 85 is provided with a standing portion 85a to which a support portion 85b is attached. The antenna 85 is maintained at a predetermined position in the Faraday shield plate 82 by the support portion 85b. The high frequency power source 87 is connected to the support portion 85b via the matching box 86. The high frequency power source 87 is capable of generating high frequency waves of 13.56 MHz, for example.

According to the plasma source 80 thus structured, when the high frequency waves are supplied to the antenna 85 from the high frequency power source 87 via the matching box 86, the electromagnetic field is generated by the antenna 85. In the electromagnetic field, the electric field component is shielded by the Faraday shield plate 82 and thus is not transmitted downward. On the other hand, the magnetic field component is transmitted within the inner space S via the plural slits 82s of the Faraday shield plate 82. Plasma is generated by the gasses such as the Ar gas, the $O_2$ gas, the $NH_3$ gas and the like which are supplied to the inner space S with a predetermined flow rate ratio (mixed ratio) from the gas introduction nozzle 92 by the magnetic field component. By such plasma, damage to a thin film formed on a wafer W, or to the components in the vacuum chamber 1 can be reduced.

As illustrated in FIG. 1, the film deposition apparatus of the embodiment further includes a control unit 100 which controls the entirety of the film deposition apparatus and a storing unit 101. The control unit 100 may be a computer. The storing unit 101 stores a program by which the film deposition apparatus executes the method for depositing a film (as will be explained later) under a control of the control unit 100. The program is formed to include steps capable of executing the method for depositing a film. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

[Method for Depositing Film]

Figure 9A:
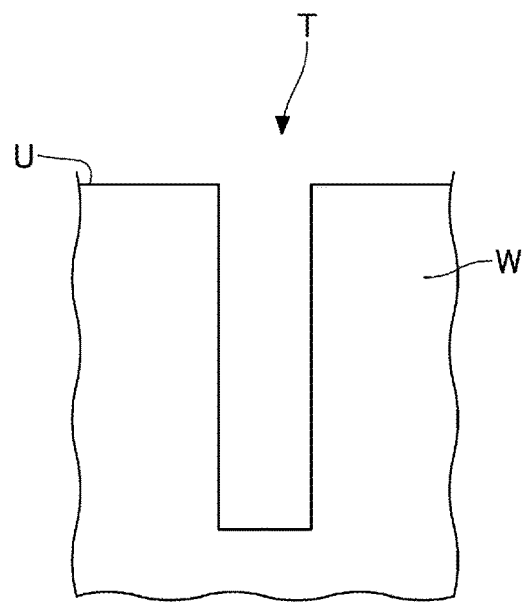
FIGS. 9A to 9D are schematic views for explaining a method for depositing a film according to an embodiment of the present disclosure.

Next, a method for depositing a film according to an embodiment of the present disclosure is described using the above-described film deposition as an example. In this embodiment, silicon wafers are used as wafers W in which a trench T is formed, as illustrated in FIG. 9A. The method for depositing a film according to the present embodiment can be applied regardless of the presence or absence of the trench T of the wafer. However, in the present embodiment, an example in which the trench T is formed on the surface of the wafer W will be described.

An aminosilane gas, for example, 3DMAS (tris(dimethylamino)silane gas) is supplied from the reaction gas nozzle 31; $O_3$ gas) is supplied as an oxidizing gas from the reaction gas nozzle 32; and a mixture of Ar gas, $O_2$ gas, and $H_2$ gas (hereinafter referred to as $Ar/O_2/H_2$ gas) is supplied from the gas introduction nozzle 92.

First, a gate valve (not illustrated in the drawings) is opened and the wafer W is passed to the recess 24 of the turntable 2 via the transfer port 15 (FIG. 2 and FIG. 3) by the transfer arm 9 (FIG. 3) from outside. This operation is performed by lifting the lift pins (not shown in the drawings) via through holes provided at a bottom surface of the recess 24 from the bottom portion side of the vacuum chamber 10 when the recess 24 stops at a position facing the transfer port 15. By repeating this operation while intermittently rotating the turntable 2, the wafers W are mounted within the recesses 24, respectively.

Then, the gate valve is closed, and the vacuum chamber 1 is evacuated by the vacuum pump 640 to the minimum vacuum level. Then, the $N_2$ gas as the separation gas is discharged from the separation gas nozzles 41 and 42 at a predetermined flow rate. At this time, the $N_2$ gas is also discharged from the separation gas supplying pipe 51 and the purge gas supplying pipes 72 and 73 at a predetermined flow rate, respectively. With this, the vacuum chamber 10 is adjusted to a predetermined set pressure by the pressure regulator 650 (FIG. 1). Then, the wafers W are heated to 600° C., for example, by the heater unit 7 while rotating the turntable 2 in a clockwise direction at a rotational speed of 20 rpm, for example.

Conventionally, plasma processes are typically carried out at low temperatures, often in the temperature range of 300° C. to 450° C. At higher temperatures, temperatures of 650° C. or higher, thermal oxidization was often used without using plasma. Thus, either a low-temperature plasma or high-temperature thermal oxidation was selected.

However, in the deposition method according to the present embodiment, the plasma process is performed at a high temperature of 600° C. or higher. This can facilitate the modification of the film in the plasma process. That is, in addition to activation of the oxidizing gas by the plasma, the effect of thermal oxidation can be obtained. The temperature can be set to a variety of temperatures when the temperature is 600° C. or higher. However, in this embodiment, because the annealing process is performed after the film deposition in addition to the high-temperature plasma process, the temperature is preferably set in a range of 750° C. or less, preferably 700° C. or less.

Subsequently, an aminosilane gas, for example, 3DMAS is supplied from the reaction gas nozzle 31 (FIG. 2 and FIG. 3) as a silicon-containing gas, and $O_3$ gas is supplied from the reaction gas nozzle 32. Further, $Ar/O_2$ gas is supplied from the gas introduction nozzle 92, and high frequency waves of 13.56 MHz with an output power of 1400 W, for example, are provided to the antenna 85 of the plasma source 80. With this, the oxygen plasma is generated in the inner space S between the plasma source 80 (FIG. 6) and the turntable 2. The oxygen plasma includes active species such as oxygen ions, oxygen radicals or the like, or high energy particles.

By the rotation of the turntable 2, the wafer W repeatedly passes the first processing region P1, the separation region D, the second processing region P2, (the lower region of) the inner space S, and the separation region D in this order (see FIG. 3).

Figure 9B:
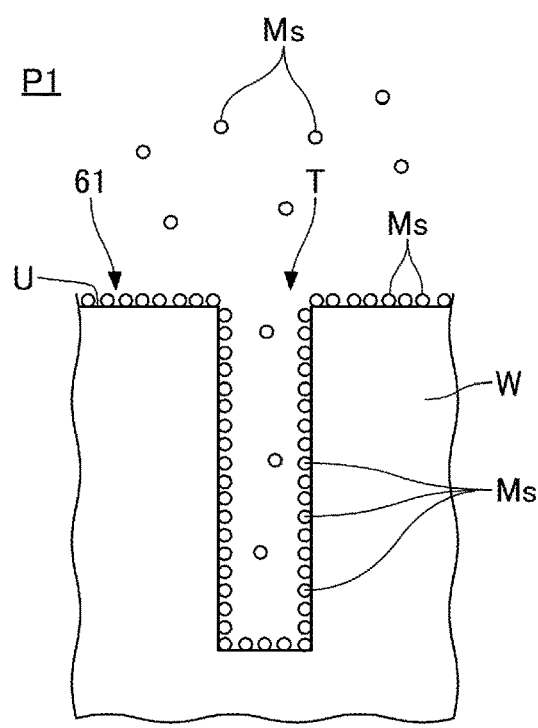

As illustrated in FIG. 9B, in the first processing region P1, a molecular layer 61 of the organic aminosilane gas is formed by adsorbing molecules Ms of the organic aminosilane gas onto a surface U of the wafer W or an inner surface of the trench T.

Figure 9C:
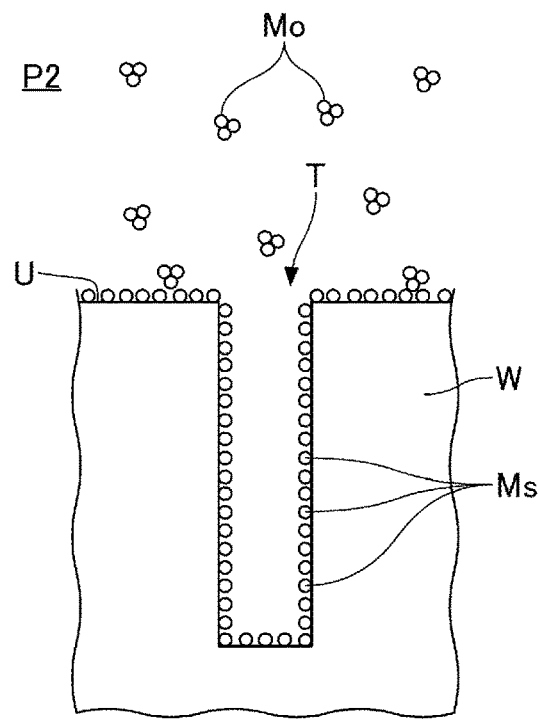

As illustrated in FIG. 9C, after passing through the separation region D, the aminosilane gas adsorbed on the surface U of the wafer W and the inner surface of the trench T is oxidized by $O_3$ gas) molecules Mo in the second processing region P2.

Figure 9D:
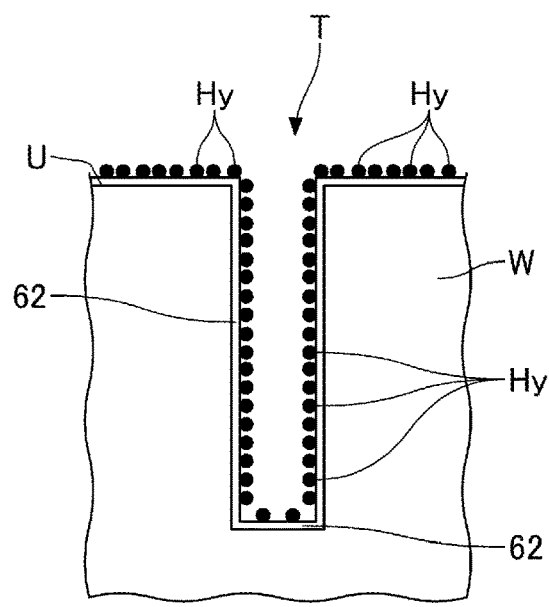

Thus, as illustrated in FIG. 9D, a silicon oxide film 62 is formed along the inner surface of the trench T. When the aminosilane gas is oxidized, an OH group Hy is formed as a by-product, and the OH group Hy is adsorbed on the surface of the silicon oxide film 62.

The 3DMAS gas can be preferably used in this embodiment because the CVD reaction does not occur at a temperature of 600° C. and the ALD process can be performed.

After the wafer W passes through the first processing region P1, the separation region D, and the second processing region P2, a silicon oxide film 62 is deposited on the inner surface of the surface U of the wafer W and the trench T as illustrated in FIG. 9D, and an OH group Hy is adsorbed on the surface of the silicon oxide film 62.

Figure 10A:
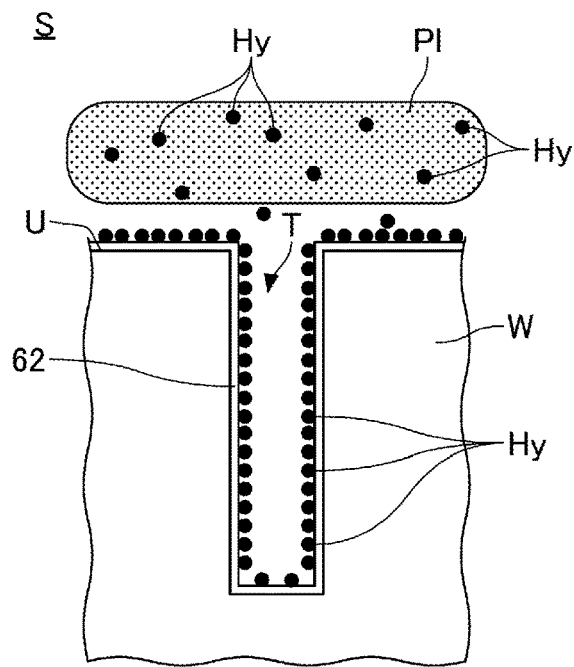
FIGS. 10A to 10E are subsequent schematic diagrams illustrating another method for depositing a film according to an embodiment of the present disclosure.

Then, as illustrated in FIG. 10A, the wafer W reaches an inner space S and the wafer W is exposed to an oxygen plasma P1. Here, the oxidation of the silicon oxide film 62 is accelerated, and the film quality is improved. As illustrated in FIG. 10A, the oxygen plasma P1 contains an OH group Hy formed from the hydrogen-containing gas. Therefore, the OH group Hy generated by the oxygen plasma P1 may be uniformly adsorbed on the surface of the silicon oxide film 62.

Figure 10B:
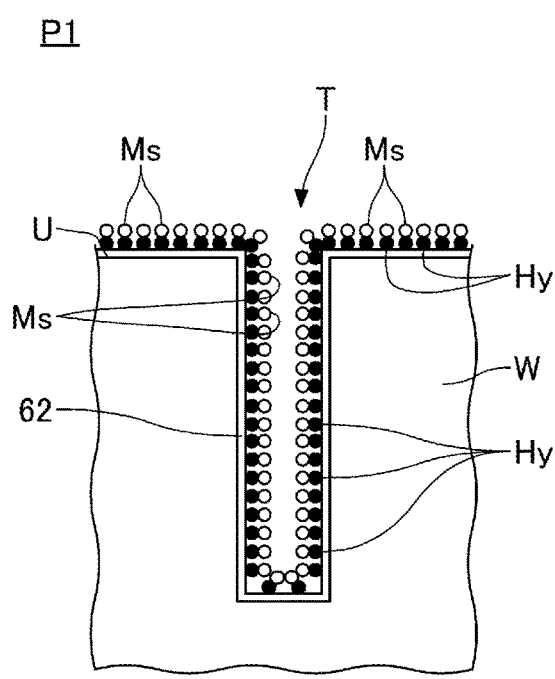

Therefore, as illustrated in FIG. 10B, when the wafer W reaches the first processing region P again, the molecules Ms of the organic aminosilane gas from the reaction gas nozzle 31 are uniformly adsorbed on the inner surface of the trench T.

Figure 10C:
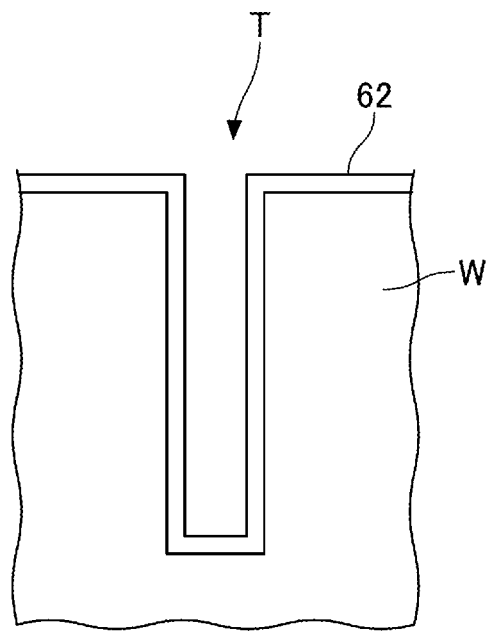

Accordingly, as illustrated in FIG. 10C, the silicon oxide film 62, which is formed by oxidizing the adsorbed organic aminosilane gas with $O_3$ gas), can also be uniformly deposited on the inner surface of the trench T.

Figure 10D:
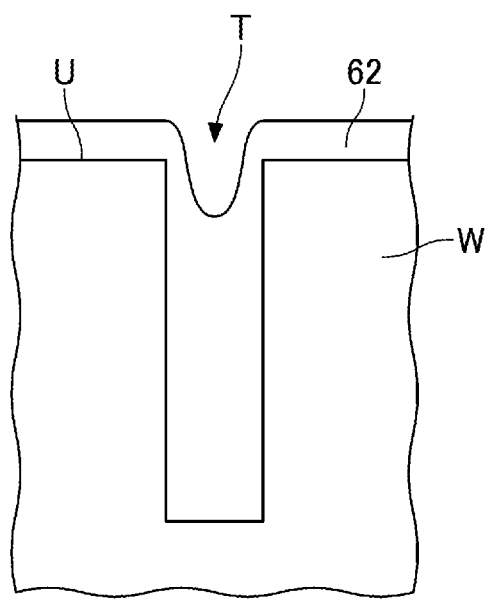

By repeating this sequence, the trench T is filled with the silicon oxide film 62, as illustrated in FIG. 10D.

Figure 10E:
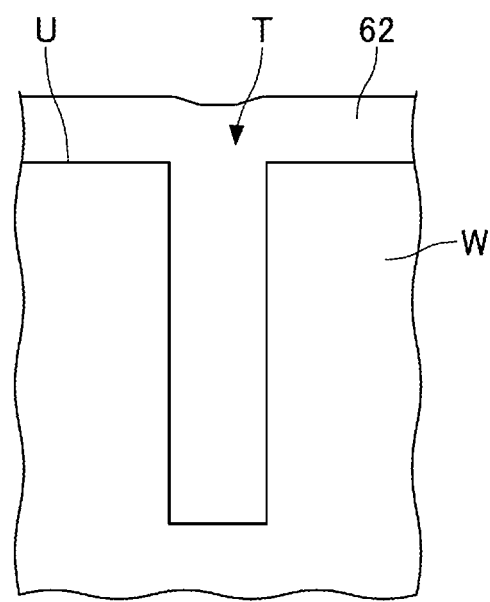

As illustrated in FIG. 10E, the trench T is ultimately filled with a silicon oxide film 62 and the trench T is filled up.

The deposited silicon oxide film has a lower wet etch rate and better quality than when deposited in a low-temperature plasma at 400° C.

However, although the film quality is improved by conventional low-temperature plasma processes, the film quality is often still poor compared to the silicon oxide film produced by thermal oxidation. That is, oxidation is often insufficient compared to that of the thermal oxide films.

Accordingly, in the method for depositing a film according to the present embodiment, after the trench T is filled, the silicon oxide film 62 is heat-treated by anneal. The anneal is carried out at a temperature higher than the film deposition temperature. That is, when the film deposition temperature is 600° C., the annealing temperature is higher than 600° C. However, when the annealing temperature differs from the film deposition temperature by 50° C. or less, because the anneal frequently has an insufficient effect, the anneal is preferably performed at a temperature higher than the film deposition temperature by 100° C. or higher, further preferably performed at a temperature higher than the film deposition temperature by 150° C. or higher, and much more preferably performed at a temperature higher than the film deposition temperature by 200° C. or higher.

For example, when a film is deposited at 600° C., the anneal is preferably performed at a temperature of 700° C. or higher, the anneal is further preferably performed at a temperature of 750° C. or higher, and the anneal is much more preferably at a temperature of 800° C. or higher.

The annealing process may be carried out in the vacuum chamber 1 or in another annealing device. When the anneal is performed in the vacuum chamber 1, the temperature of the heater unit 7 is set at a temperature exceeding 600° C., for example 800° C.

However, in a film deposition apparatus for performing a plasma process, in many cases, the film deposition apparatus is not manufactured on the assumption that the anneal level is high. In such a case, the wafer W is removed from the vacuum chamber 1 and transferred to an annealing device for annealing.

[Film Deposition System]

Figure 11A:
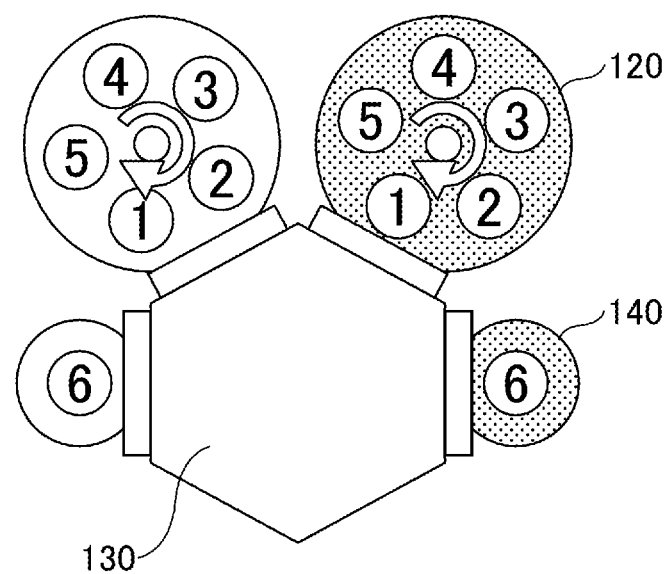
FIGS. 11A and 11B are diagrams illustrating an example of an overall configuration when an annealing device is disposed.
Figure 11B:
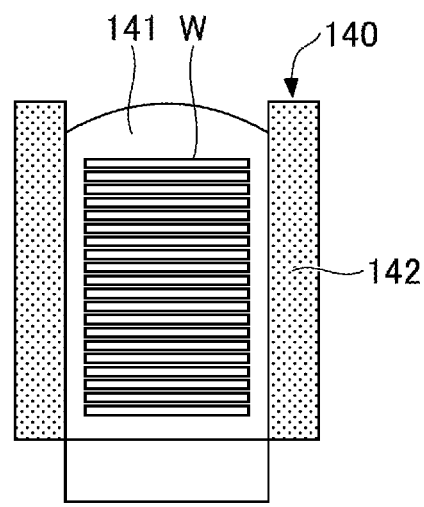

FIGS. 11A and 11B are diagrams illustrating an example of an overall configuration of a film deposition system when an annealing device is disposed. FIG. 11A is a diagram illustrating an example of the overall configuration of a film forming device and an annealing device.

As illustrated in FIG. 11A, a film deposition apparatus 120 and an annealing device 140 according to the present embodiment are disposed in a film deposition apparatus of a cluster type. A transfer station 130 is provided between the film deposition apparatus 120 and the annealing device 140. After the film deposition process is completed, the wafer W is conveyed to the annealing device 140 via the transfer station 130. A thermal treatment is then performed by the annealing device.

FIG. 11B is a cross-sectional view illustrating an example of an annealing device. As illustrated in FIG. 11B, wafers W may be annealed by loading a plurality of wafers W into a processing chamber 141 and heating with a heater 142. After annealing, the wafer W may be carried out of the annealing device 141 through the transfer station 130.

As described above, the film deposition apparatus 120 and the annealing device 140 may be disposed adjacent to each other, and the wafers W may be transferred from the film deposition apparatus 120 to the annealing device 140 using a transfer device such as the transfer station 130, and the annealing process may be performed.

By performing such a treatment, the silicon oxide film 62 on the wafer W can have the same uniform quality as that of the thermal oxide film.

EXAMPLE

Hereinafter, examples of a performed method for depositing a film according to the present embodiment will be described.

Example 1

Figure 12:
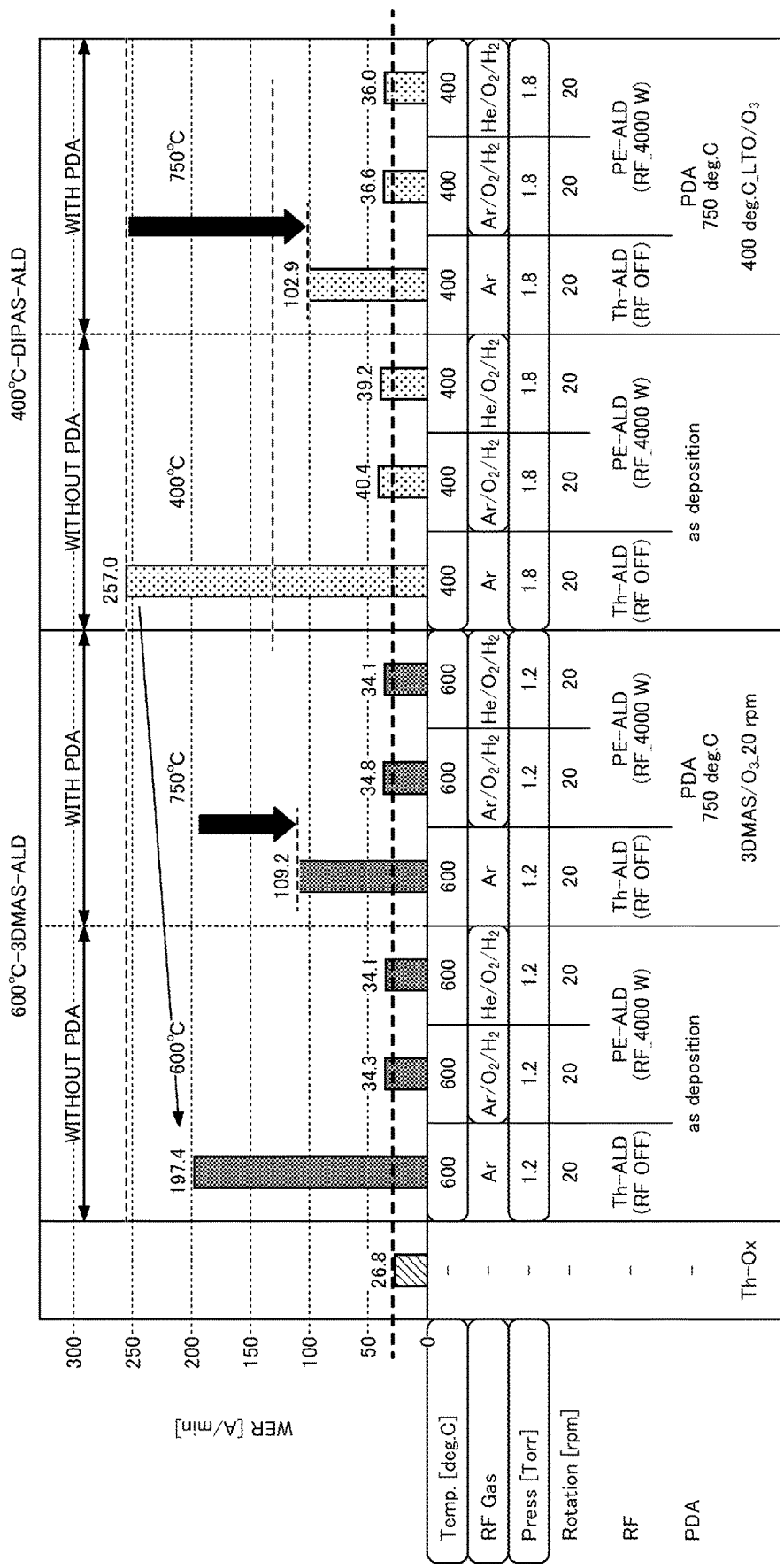
FIG. 12 is a diagram illustrating a result of a first example.

FIG. 12 is a diagram showing results of Example 1. In Example 1, a low-temperature plasma at 400° C. and a high-temperature plasma at 600° C. were compared in the case of depositing a silicon oxide film with ALD on a flat surface.

The left side of FIG. 12 shows the results of ALD using 3DMAS as a silicon-containing gas at 600° C., and the right side shows the results of ALD using DIPAS (di-isopropylamino silane, diisopropylaminosilane) as a silicon-containing gas at 400° C.

In FIG. 12, letters of the alphabet "PDA" are referred to as Post Deposition Anneal, meaning an anneal after deposition. Also, the longitudinal axis represents a wet etch rate [A/min], which means that wet etching is performed after deposition, and that a lower etch rate results in a denser, higher quality film. Conditions include ALD on a flat surface of a wafer W, where a mixture of $Ar/O_2/H_2$ was used as the plasma gas. The pressure was 1.2 [Torr], and the rotation speed of the turntable 2 was 20 [rpm].

Comparing the processes without anneals after the film deposition, the high temperature plasma process at 600° C. has a lower etch rate than the low temperature plasma process at 400° C. in both cases of a process without plasma and a process using high frequency power with an output of 4000 W. Thus, the film quality of the 600° C. high-temperature plasma is better than that of the conventional 400° C. low-temperature plasma.

In addition, when the post-deposition annealing at 750° C. is performed, when the plasma process is not performed, the etch rate is lower in the 400° C. process, but when the high-temperature plasma and the post-deposition anneal are compared, the etch rate is lower in the combination of the high-temperature plasma and the post-deposition anneal than in the low-temperature plasma and the post-deposition anneal.

Thus, Example 1 indicates that the high-temperature plasma at 600° C. has a better film quality than the low-temperature plasma at 400° C. in both cases of the presence and absence of the post-deposition annealing.

Example 2

Figure 13:
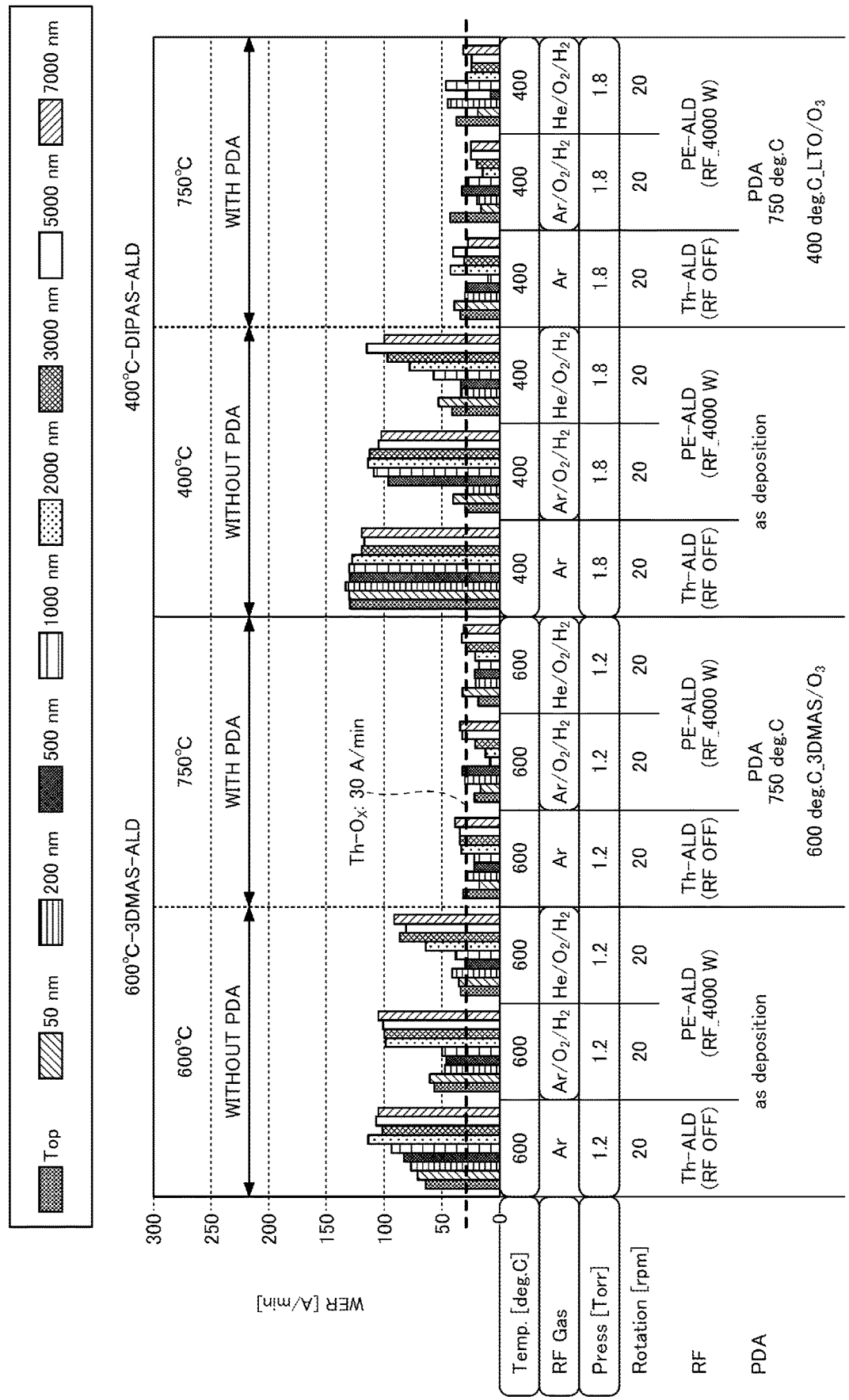
FIG. 13 is a diagram illustrating a result of a second example.

FIG. 13 is a diagram showing results of Example 2. In Example 2, a low-temperature plasma at 400° C. and a high-temperature plasma at 600° C. were compared to each other with respect to film quality in the case where a silicon oxide film was deposited by ALD on a wafer W including a recess pattern formed therein. The deposition conditions were the same as those of Example 1, but the etch rate was measured according to the depth of the trench T. The measurement points were as follows from the left: top; 50 nm depth from the top; 200 nm depth from the top; 500 nm depth from the top; 1000 nm depth from the top; 2,000 nm depth from the top; 3000 nm depth from the top; 5000 nm depth from the top; and 7000 nm depth from the top.

In the left column, when the case of a 600° C. high-temperature plasma process and no post-deposition anneal is compared to the case of a 400° C. low-temperature plasma process and no post-deposition anneal, the high-temperature plasma process at 600° C. has a lower etch rate and a better film quality.

In addition, even when the post-deposition annealing at 750° C. is performed on the right side, the etch rate of the high-temperature plasma process at 600° C. is lower than that of the low-temperature plasma process at 400° C., while indicating that the film has a good quality.

Thus, Example 2 indicates that the high-temperature plasma process at 600° C. has a better film quality than that of the low-temperature plasma process at 400° C., as well as the film deposition on the flat surface and the film deposition into the recess pattern.

Example 3

Figure 14:
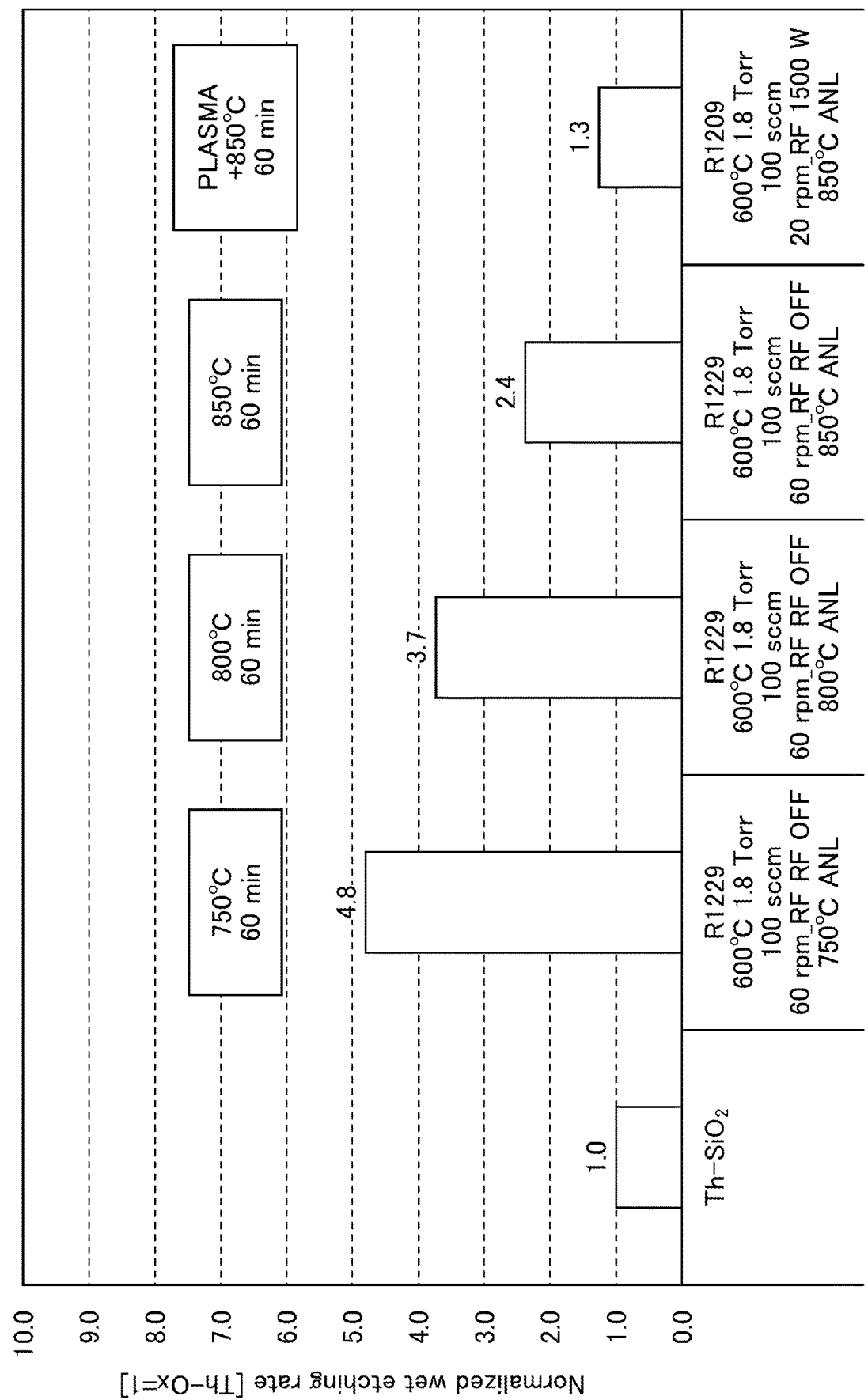
FIG. 14 is a diagram illustrating a result of a third example.

FIG. 14 is a diagram illustrating results of Example 3. FIG. 14 shows how the etch rate varies with the temperature of the post-deposition anneal in comparison to the thermal oxide film. The etch rate of the thermal oxide film is normalized to 1 as shown at the left end.

The anneal after deposition is 4.8 at 750° C. for 60 minutes and 3.7 at 800° C. for 60 minutes. At 850° C. for 60 minutes, the result is 2.4. These are the results of the absence of the plasma process and exhibit annealing properties. Only annealing has the lowest value of 2.4, which is far from 1.0 of the thermal oxide film. However, as shown on the rightmost side of FIG. 14, annealing after deposition at 850° C. in conjunction with a 600° C. high temperature plasma process reduces the etch rate to 1.3 and brings the film very close to the thermal oxide.

Thus, Example 3 indicates that when a high-temperature plasma process and a post-deposition anneal are combined, the film quality of the silicon oxide film can be improved to the level of the thermal oxide film.

Example 4

Figure 15:
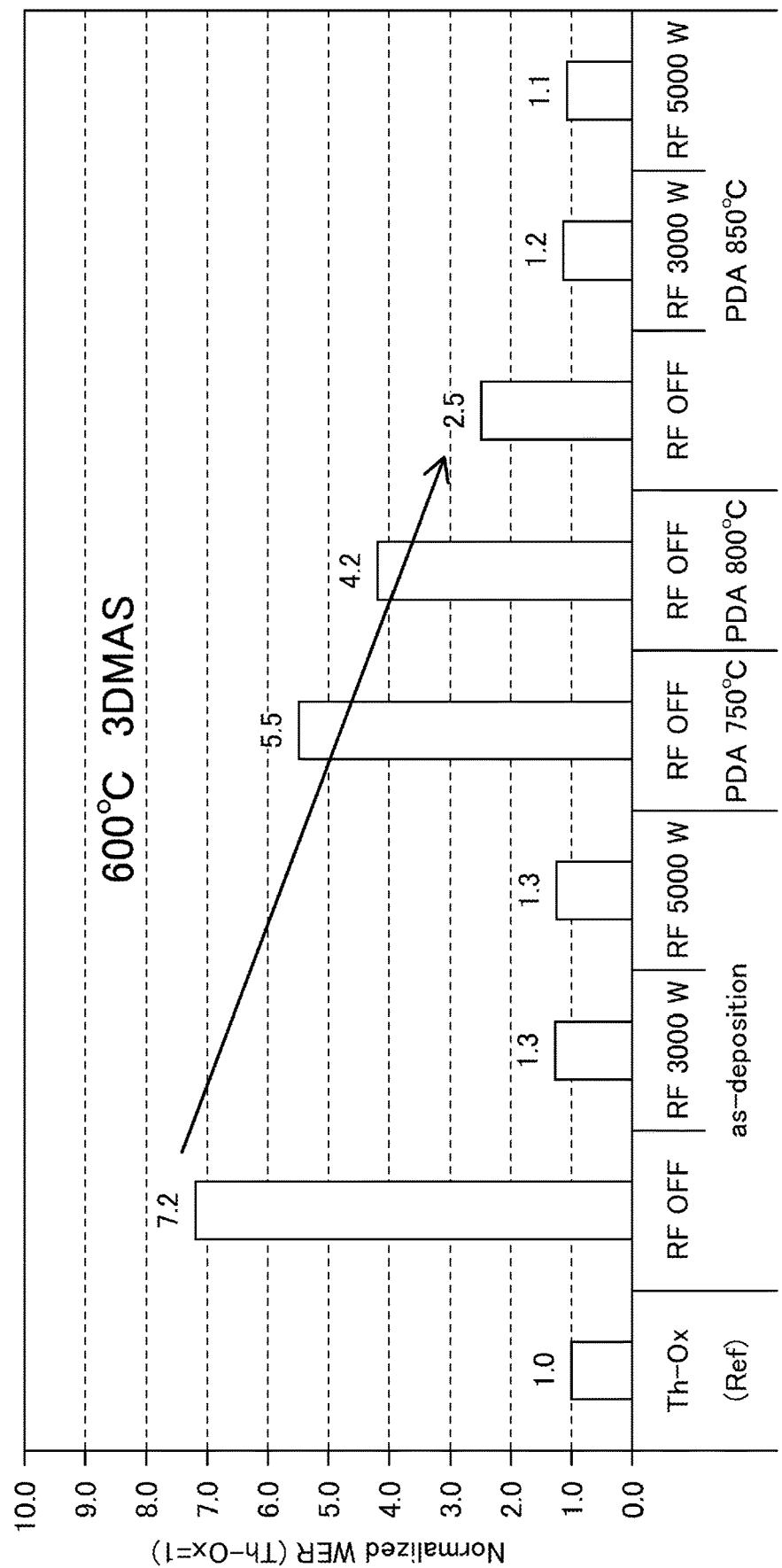
FIG. 15 is a diagram illustrating a result of a fourth example.

FIG. 15 is a diagram showing results of Example 4. In Example 4, similarly to Example 3, the etch rate of the thermal oxide film was set to 1, and the effect of the output of the high frequency power supply in the high temperature plasma process at 600° C. was investigated.

In FIG. 15, the leftmost side indicates the etch rate of the thermal oxide. The next three graphs on the right side show an example in which the output of the high frequency power supply was gradually increased without annealing after deposition. While the plasma was turned off, the etch rate of 7.2 decreased to 1.3 when the output of the high frequency power was reduced to 3000 W, and the etch rate did not change at 1.3 when the output was increased to 5000 W.

Then, when the post-deposition anneal was performed at 750° C., the etch rate was 5.5 without plasma. Increasing the anneal temperature after the film deposition to 800° C. without plasma lowered the etch rate to 4.2. When the anneal temperature was raised to 850° C., the etch rate was reduced to 2.5. Then, the etch rate decreased to 1.2 when the high temperature plasma process at 600° C. was performed while keeping the post-deposition anneal at 850° C. and the high frequency power output of the plasma at 3000 W. Furthermore, when the output of the high frequency power supply was increased to 5000 W, the etch rate decreased to 1.1, which is very close to the etch rate of the thermal oxide film.

Thus, Example 4 indicates that the film quality of the thermal oxide film level can be achieved by raising the high-temperature plasma process at 600° C. and the temperature of the anneal after the high-temperature plasma process to 850° C.

Example 5

Figure 16A:
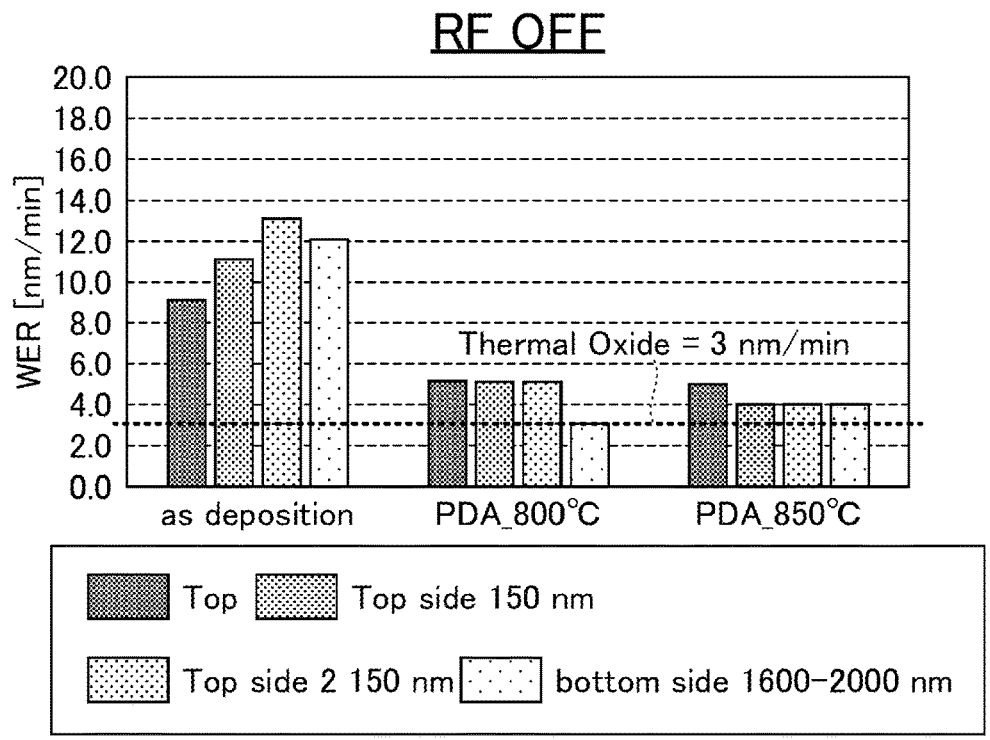
FIGS. 16A and 16B are diagrams illustrating a result of a fifth example.
Figure 16B:
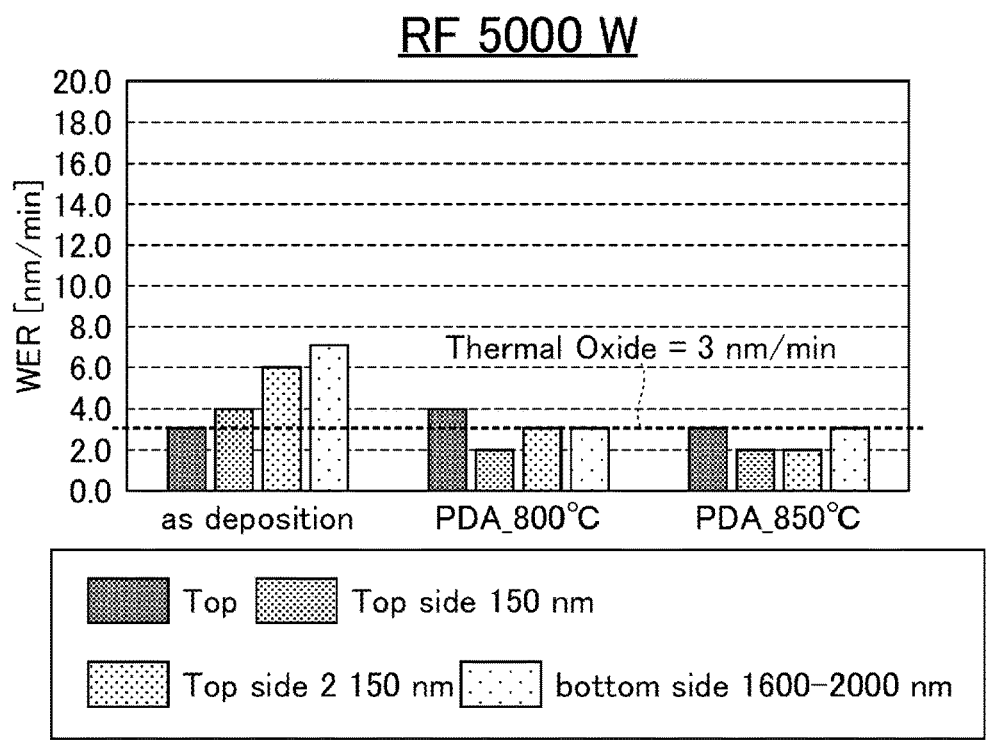

FIGS. 16A and 16B are diagrams illustrating results of Example 5. In Example 5, an effect of an anneal after film deposition and an effect of a high temperature plasma were measured.

FIG. 16A shows an example in which an effect of an anneal after film deposition was measured without generating plasma. As illustrated in FIG. 16A, an etch rate is very high without an anneal, but when the anneal is performed after film deposition at 800° C. and when the anneal is performed after film deposition at 850° C., the etch rate is significantly reduced. Measurements were performed on the patterned wafer at four points: the top, 50 nm depth from the top, 150 nm depth from the top, and 1600 to 2000 nm depth from the top.

In FIG. 16A, the etch rate of the dashed line at 3 nm/min is the etch rate of the thermal oxide film, which is an acceptable line, and the etch rate is required to be lower than the acceptable line. As illustrated in FIG. 16A, the thermal oxide films only with the anneal after deposition were not able to reach the acceptable line.

FIG. 16B shows the case where a high temperature plasma process was performed at the output of a 5000 W high frequency power supply. First, as illustrated in FIG. 16B, the etch rate substantially decreases when a high temperature plasma process is introduced. However, only the etch rate at the top point reached the acceptable line, but the etch rates at the other measurement points did not reach the acceptable line.

After annealing after film deposition at 800° C., three non-top points reached the acceptance line. Then, when the temperature of the post-deposition anneal was raised to 850° C., the etch rates at all measurement points cleared the acceptable line.

Thus, Example 5 indicates that a silicon oxide film with a film quality better than the level of the thermal oxide film can be formed when a high-temperature plasma process is performed at a high output of 5000 W and the anneal is set to a high temperature of 850° C.

As described above, according to the method for depositing a film according to the embodiments, the film quality of the silicon oxide film can be improved to the level of the thermal oxide film by performing ALD with a high-temperature plasma process of 600° C. or higher and an anneal after the film deposition at a higher temperature than that of the high-temperature plasma process.

Thus, according to the present disclosure, it is possible to deposit a silicon oxide film having a uniform film quality equivalent to that of a thermal oxide film.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for depositing a silicon oxide film, the method comprising:
   depositing a silicon oxide film on a substrate in a first device by Atomic Layer Deposition with plasma while heating the substrate to a first temperature of 600° C. or higher, said plasma being generated by supplying a reaction gas and applying 5000 W that is output from a power supply;
   transferring the substrate to a second device from the first device after the silicon oxide film is deposited on the substrate, and
   annealing the silicon oxide film at 850° C. in the second device.

2. The method as claimed in claim 1,
   wherein the depositing the silicon oxide film comprises:
   adsorbing a silicon-containing gas on the substrate;
   oxidizing the silicon-containing gas adsorbed on the substrate by supplying a first oxidizing gas to the substrate, thereby depositing the silicon oxide film on the substrate;
   modifying the silicon oxide film by supplying a second oxidizing gas activated by plasma to the silicon oxide film; and
   repeating the adsorbing the silicon-containing gas, the oxidizing the silicon-containing gas, and the modifying the silicon oxide film.

3. The method as claimed in claim 2,
   wherein the first temperature is lower than 700° C.

4. The method as claimed in claim 2,
   wherein the first oxidizing gas is ozone, and
   wherein the second oxidizing gas contains oxygen.

5. The method as claimed in claim 4, wherein the second oxidizing gas is a mixed gas containing oxygen and hydrogen.

6. The method as claimed in claim 2, wherein the silicon-containing gas is an aminosilane gas.

7. The method as claimed in claim 6, wherein the aminosilane gas is tris(dimethylamino) silane gas.

8. The method as claimed in claim 1, wherein the annealing is performed for 60 minutes.

* * * * *